US012777707B2

(12) United States Patent
Yao

(10) Patent No.: US 12,777,707 B2
(45) Date of Patent: Oct. 27, 2026

(54) HIGH-BANDGAP(EG) STRUCTURE IN PLANAR FLOATING-BASE BIPOLAR PHOTOTRANSISTOR (PT)

(71) Applicant: WAVEFRONT HOLDINGS, LLC, Basking Ridge, NJ (US)

(72) Inventor: Jie Yao, Basking Ridge, NJ (US)

(73) Assignee: WAVEFRONT HOLDINGS, LLC, Basking Ridge, NJ (US)

( * ) Notice: Subject to any disclaimer, the term of this patent is extended or adjusted under 35 U.S.C. 154(b) by 332 days.

(21) Appl. No.: 18/658,063

(22) Filed: May 8, 2024

(65) Prior Publication Data

US 2025/0318288 A1 Oct. 9, 2025

Related U.S. Application Data

(60) Provisional application No. 63/468,190, filed on May 22, 2023.

(51) Int. Cl.

*H10F 30/24* (2025.01)
*H10D 84/08* (2025.01)

(Continued)

(52) U.S. Cl.

CPC ........... *H10D 84/08* (2025.01); *H10F 30/245* (2025.01); *H10F 77/1226* (2025.01); *H10F 77/1248* (2025.01); *H10F 77/162* (2025.01)

(58) Field of Classification Search

CPC . H10D 84/08; H10F 77/1248; H10F 77/1226; H10F 30/245; H10F 77/162

See application file for complete search history.

(56) References Cited

U.S. PATENT DOCUMENTS

2022/0149098 A1* 5/2022 Wang .................... H10F 30/225
2022/0373463 A1* 11/2022 Kelley .............. G01N 21/6452

OTHER PUBLICATIONS

S. M. Sze et al., "Physics of Semiconductor Devices", John Wiley & Sons, Inc., Third Edition, pp. 694-697 (2007).

* cited by examiner

*Primary Examiner* — William C Trapanese
(74) *Attorney, Agent, or Firm* — Pillsbury Winthrop Shaw Pittman, LLP

(57) ABSTRACT

A semiconductor bipolar phototransistor (PT) comprises a floating base consisting of a base (b) electrically coupled only to (i) an emitter (e) via an emitter junction (ej); and (ii) a collector (c) via a collector junction (cj) conductively, capacitively or inductively. A substantially planar semiconductor interface is formed between the semiconductor and a dielectric. A semiconductor volume of highest bandgap (Eg) whose bandgap is higher than the bandgap of the remaining semiconductor volume of the semiconductor bipolar phototransistor (PT) within about 1 micron linear distance from the substantially planar semiconductor interface with the dielectric. The emitter junction (ej) comprises an emitter junction (ej) portion with a bandgap lower than the bandgap of the highest bandgap volume. The base (b) comprises a base (b) portion with a bandgap lower than the bandgap of the highest bandgap volume. The collector junction (cj) comprises a collector junction (cj) portion with a bandgap lower than the bandgap of the highest bandgap volume. A first low-doped region of the highest bandgap volume resides within the emitter junction (ej). A second low-doped region of the highest bandgap volume resides within the base (b). A third low-doped region of the highest bandgap volume resides within the collector junction (cj). A minimum linear dimension of the highest bandgap volume is at least 10 nanometers. The highest bandgap volume is sub- (Continued)

stantially single crystalline. The first, second, and third low-doped regions of the highest bandgap volume are not doped to higher than $10^{16}/cm^3$.

24 Claims, 1 Drawing Sheet

(51) Int. Cl.

| | |
|---|---|
| ***H10F 77/1226*** | (2025.01) |
| ***H10F 77/124*** | (2025.01) |
| ***H10F 77/162*** | (2025.01) |

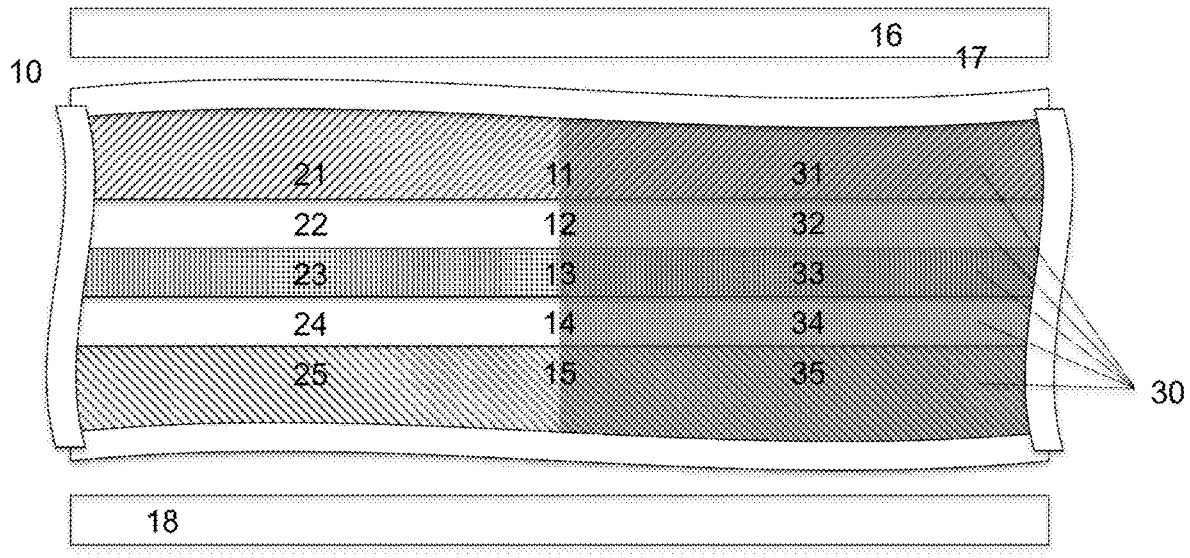
16
17
10
21
11
31
22
12
32
23
13
33
24
14
34
25
15
35
30
18

HIGH-BANDGAP(EG) STRUCTURE IN PLANAR FLOATING-BASE BIPOLAR PHOTOTRANSISTOR (PT)

CROSS-REFERENCE TO RELATED APPLICATIONS

This application refers to and claims the priority date of U.S. provisional patent 63/468,190 entitled "HighEgPT&IsothermalBond" filed on 22 May 2023 with EFS ID 48040488, the disclosure of which is hereby incorporated by reference in its entirety.

STATEMENT REGARDING FEDERALLY SPONSORED RESEARCH OR DEVELOPMENT

This invention was made in part with Government support under contracts N6833521C0004, FA9453-22-C-A011 and W9113M22C0080 awarded by the U.S. Department of Defense. The Government has certain rights in the invention.

FIELD OF THE EMBODIMENTS

The embodiments relate to semiconductor phototransistor (PT) comprising low-doped regions of a highest bandgap volume within its emitter junction (ej), base (b) and collector junction (cj). Embodiments also relate to methods of making the semiconductor phototransistor (PT).

DESCRIPTION OF RELATED ART

A phototransistor (PT) generates an output current depending on the flux of incident light. Photons absorbed in a phototransistor (PT) generate electron-hole pairs collected by p-n junctions. Minority carriers collected by the p-n junctions operate as a base (b) current. The base current is amplified based on a bipolar transistor gain, thereby generating an emitter current and a collector current. The very small number of photo generated carriers, depending on the location of origin, can either flow to the emitter (e) to reduce the emitter (e) current or flow to the collector (c) to enhance the collector (c) current. An emitter (e) current or a collector (c) current is generally used as an output current. Conventional phototransistors (PTs) and their use in sensors are disclosed in, for example, S. M. Sze and Kwok K. Ng, "Physics of Semiconductor Devices", 3rd edition, Wiley Interscience, John Wiley & Sons, Inc., 2007, ISBN-13:978-0-471-14323-9, ISBN-10:0-471-14323-5, Chapter 13 "Photodetectors and Solar Cells", Section 13.5 "Phototransistors", pp. 694-697, the disclosures of which is incorporated by reference herein in their entirety.

SUMMARY OF THE EMBODIMENTS

A feature of an embodiment includes a semiconductor bipolar phototransistor (PT) that comprises a floating base consisting of a base (b) electrically coupled only to: (i) an emitter (e) via an emitter junction (ej); and (ii) a collector (c) via a collector junction (cj) conductively, capacitively or inductively. A substantially planar semiconductor interface can be formed between the semiconductor and a dielectric. In an embodiment, a semiconductor volume of highest bandgap (Eg) has bandgap higher than the bandgap of the remaining semiconductor volume of the semiconductor bipolar phototransistor (PT) within about 1 micron linear distance from the substantially planar semiconductor interface with the dielectric. The emitter junction (ej) comprises an emitter junction (ej) portion with a bandgap lower than the bandgap of the highest bandgap volume. The base (b) comprises a base (b) portion with a bandgap lower than the bandgap of the highest bandgap volume. The collector junction (cj) comprises a collector junction (cj) portion with a bandgap lower than the bandgap of the highest bandgap volume. A first low-doped region of the highest bandgap volume resides within the emitter junction (ej). A second low-doped region of the highest bandgap volume resides within the base (b). A third low-doped region of the highest bandgap volume resides within the collector junction (cj).

In an embodiment, the minimum linear dimension of the highest bandgap volume is at least 10 nanometers. In another embodiment, the highest bandgap volume is substantially single crystalline. In yet another embodiment, the first, second, and third low-doped regions of the highest bandgap volume are not doped to higher than $10^{16}/cm^3$.

BRIEF DESCRIPTION OF THE FIGURE

FIG. 1 shows the topology (not geometry, not to scale) of 5 regions of highest-bandgap volume inside the emitter (e), emitter junction (ej), base (b), collector junction (cj) and collector (c) of the semiconductor planar floating-base bipolar phototransistor (PT). FIG. 1 is a cross-section view of the topology (not geometry, not to scale) of part of phototransistor (PT).

DETAILED DESCRIPTION

A semiconductor bipolar phototransistor (PT) is defined herein consistent with the definition of phototransistor (PT) in the relevant art, including, but not limited to: S. M. Sze and Kwok K. Ng, "Physics of Semiconductor Devices", Third Edition, John Wiley & Sons, 2007, ISBN-13:978-0-471-14323-9, ISBN-10:0-471-14323-5, Section 13.5 on pages 694 through 697). Additional terms and phrases used herein also are described and defined according to this publication, including but not limited to the claimed "volume of highest bandgap (Eg)." As described herein, the device resulting from the incorporation of the claimed "volume of highest bandgap (Eg)" and/or other structures into a phototransistor (PT) is still within the scope of the definition of a phototransistor (PT).

The phototransistor (PT) emitter (e), emitter junction (ej), base (b), collector junction (cj) and collector (c) are respectively defined accordingly and similarly herein.

[****] A phototransistor (PT) emitter (e) is used herein to denote a phototransistor (PT) emitter (e) as defined in the relevant art plus additional claimed structures including but not limited to the claimed "region of said highest bandgap (Eg) volume". As described herein, the structure resulting from the incorporation of the claimed "region of said highest bandgap (Eg) volume" and/or other structures into a phototransistor (PT) emitter (e) is still within the scope of the definition of a phototransistor (PT) emitter (e).

A phototransistor (PT) emitter junction (ej) is used herein to denote a phototransistor (PT) emitter junction (ej) as defined in the relevant art plus additional claimed structures including but not limited to the claimed "low-doped region of said highest bandgap (Eg) volume". As described herein, the structure resulting from the incorporation of the claimed "low-doped region of said highest bandgap (Eg) volume" and/or other structures into a phototransistor (PT) emitter junction (ej) is still within the scope of the definition of a phototransistor (PT) emitter junction (ej).

A phototransistor (PT) base (b) is used herein to denote a phototransistor (PT) base (b) as defined in the relevant art plus additional claimed structures including but not limited to the claimed "low-doped region of said highest bandgap (Eg) volume". As described herein, the structure resulting from the incorporation of the claimed "low-doped region of said highest bandgap (Eg) volume" and/or other structures into a phototransistor (PT) base (b) is still within the scope of the definition of a phototransistor (PT) base (b).

A phototransistor (PT) collector junction (cj) is used herein to denote a phototransistor (PT) collector junction (cj) as defined in the relevant art plus additional claimed structures including but not limited to the claimed "low-doped region of said highest bandgap (Eg) volume". As described herein, the structure resulting from the incorporation of the claimed "low-doped region of said highest bandgap (Eg) volume" and/or other structures into a phototransistor (PT) collector junction (cj) is still within the scope of the definition of a phototransistor (PT) collector junction (cj).

A phototransistor (PT) collector (c) is used herein to denote a phototransistor (PT) collector (c) as defined in the relevant art plus additional claimed structures including but not limited to the claimed "region of said highest bandgap (Eg) volume". As described herein, the structure resulting from the incorporation of the claimed "region of said highest bandgap (Eg) volume" and/or other structures into a phototransistor (PT) collector (c) is still within the scope of the definition of a phototransistor (PT) collector (c).

For the simplicity and clarity, all dopant-dependent bandgap narrowing effects in all regions of the highest bandgap volume are generally neglected due to their negligible corrections to bandgap (Eg) as far as the fundamental concepts disclosed herein are concerned. Therefore, the highest bandgap volume is defined to have the same highest bandgap (Eg) across all its multiple differently doped regions because the negligible differences in dopant-dependent bandgap narrowing caused by different doping in differently doped regions within one and the same claimed highest bandgap volume are neglected.

A semiconductor surface is defined as the interface between the semiconductor and a non-semiconductor material or vacuum. Namely, a semiconductor surface is defined as the combination of the interface between the semiconductor and vacuum, the interface between the semiconductor and air, the interface between the semiconductor and dielectric, and the interface between the semiconductor and metal. An interface between two materials is defined as a portion of a two-dimensional surface at which the two materials form direct physical contact with each other.

A semiconductor section is defined as undoped if and only if it is not intentionally doped. An undoped semiconductor section, therefore, allows doping caused by impurities or defects not intentionally incorporated into the section, and typically has a non-zero unintentional background doping level. An undoped semiconductor section does not require its unintentional background doping level to be zero.

In one embodiment shown in FIG. 1, a semiconductor bipolar phototransistor (PT) 10 comprises a floating base 13 consisting of a base (b) electrically coupled only to (i) an emitter (e) 11 via an emitter junction (ej) 12; and (ii) a collector (c) 15 via a collector junction (cj) 14 conductively, capacitively or inductively. A substantially planar semiconductor interface 17 is formed between the semiconductor and a dielectric 16. A semiconductor volume of highest bandgap (Eg) 30 whose bandgap is higher than the bandgap of the remaining semiconductor volume of the semiconductor bipolar phototransistor (PT) 10 within about 1 micron linear distance from the substantially planar semiconductor interface 17 with the dielectric 16. The emitter junction (ej) 12 comprises an emitter junction (ej) portion 22 with a bandgap lower than the bandgap of the highest bandgap volume 30. The base (b) 13 comprises a base (b) portion 23 with a bandgap lower than the bandgap of the highest bandgap volume 30. The collector junction (cj) 14 comprises a collector junction (cj) portion 24 with a bandgap lower than the bandgap of the highest bandgap volume 30. A first low-doped region 32 of the highest bandgap volume 30 resides within the emitter junction (ej) 12. A second low-doped region 33 of the highest bandgap volume 30 resides within the base (b) 13. A third low-doped region 34 of the highest bandgap volume 30 resides within the collector junction (cj) 14. A minimum linear dimension of the highest bandgap volume 30 is at least 10 nanometers. The highest bandgap volume 30 is substantially single crystalline. The first, second, and third low-doped regions 32, 33 and 34 of the highest bandgap volume 30 are not doped to higher than $10^{16}/cm^3$.

In the semiconductor bipolar phototransistor (PT) 10, the highest bandgap volume 30 is substantially not strain-relaxed, is not compressively strained and is either lattice-matched or pseudomorphic to a bipolar phototransistor (PT) substrate 18. In the semiconductor bipolar phototransistor (PT) 10, the highest bandgap volume 30 has tensile strain and is pseudomorphic to a bipolar phototransistor (PT) substrate 18.

In the semiconductor bipolar phototransistor (PT) 10, the first, second, and third low-doped regions 32, 33 and 34 of the highest bandgap volume 30 are preferably not doped to higher than $10^{15}/cm^3$. In the semiconductor bipolar phototransistor (PT) 10, the first, second, and third low-doped regions 32, 33 and 34 of the highest bandgap volume 30 are not intentionally doped.

In the semiconductor bipolar phototransistor (PT) 10, the emitter 11 comprises an emitter (e) portion 21 with a bandgap lower than the bandgap of the highest bandgap volume 30. In the semiconductor bipolar phototransistor (PT) 10, the collector 15 comprises a collector (c) portion 25 with a bandgap lower than the bandgap of the highest bandgap volume 30. In the semiconductor bipolar phototransistor (PT) 10, the emitter 11 comprises an emitter (e) portion 21, and the collector 15 comprises a collector (c) portion 25, each portion having a bandgap lower than the bandgap of the highest bandgap volume 30.

In the semiconductor bipolar phototransistor (PT) 10, an additional region 31 of the highest bandgap volume 30 resides within the emitter (e) 11. In the semiconductor bipolar phototransistor (PT) 10, an additional region 35 of the highest bandgap volume 30 resides within the collector (c) 15. In the semiconductor bipolar phototransistor (PT) 10, two additional regions 31 and 35 of the highest bandgap volume 30 reside within the emitter (e) 11 and the collector (c) 15, respectively.

In the semiconductor bipolar phototransistor (PT) 10, at least one section of the highest bandgap volume 30 is doped. In the semiconductor bipolar phototransistor (PT) 10, at least one section of the highest bandgap volume 30 is intentionally doped. In the semiconductor bipolar phototransistor (PT) 10, the minimum linear dimension of the highest bandgap volume 30 is less than 100 nanometers. In the semiconductor bipolar phototransistor (PT) 10, the minimum linear dimension of the highest bandgap volume 30 is less than 30 nanometers. In the semiconductor bipolar phototransistor (PT) 10, the semiconductor volume 30 of the highest bandgap (Eg) has bandgap higher than the bandgap of the remaining semiconductor volume of the semiconductor bipolar phototransistor (PT) 10 within about 10 microns linear distance from the substantially planar semiconductor interface 17 with the dielectric 16.

In the semiconductor bipolar phototransistor (PT) 10, a bipolar phototransistor (PT) substrate 18 is InP (doped or undoped indium phosphide), and wherein the highest bandgap volume 30 comprises In(x)Al(1-x)As, wherein $0<x<1$. In the semiconductor bipolar phototransistor (PT) 10, a bipolar phototransistor (PT) substrate 18 is InP (doped or undoped indium phosphide), and wherein the highest bandgap volume 30 comprises pseudomorphic strained In(x)Al(1-x)As, wherein x=0.35±0.05, with tensile strain. In the semiconductor bipolar phototransistor (PT) 10, a bipolar phototransistor (PT) substrate 18 is InP (doped or undoped indium phosphide), and wherein the highest bandgap volume 30 comprises pseudomorphic strained In(x)Al(1-x)As, wherein x=0.35±0.01, with tensile strain.

In the semiconductor bipolar phototransistor (PT) 10, the substantially planar semiconductor interface 17 with dielectric 16 is substantially parallel to a bipolar phototransistor (PT) substrate 18. An array of multiple semiconductor bipolar phototransistors (PTs) 10 share the same substantially planar semiconductor interface 17 with dielectric 16, and share an electrically conductively connected continuous common collector (c) 15 or common sub-collector.

In an embodiment described herein, a method of fabricating a semiconductor bipolar phototransistor (PT) 10 comprises epitaxially growing the highest bandgap volume 30 as an epitaxial layer comprising not intentionally doped region(s) 32, 33 and/or 34. In another embodiment described herein, a method of fabricating the semiconductor bipolar phototransistor (PT) 10 comprises epitaxially re-growing the highest bandgap volume 30 as an epitaxial re-growth layer comprising not intentionally doped region(s) 32, 33 and/or 34.

In yet another embodiment shown in FIG. 1, the semiconductor bipolar phototransistor (PT) 10 includes a bipolar phototransistor (PT) substrate 18 comprised of doped or undoped Si, and the highest bandgap volume 30 comprises pseudomorphic strained Si(1-x)C(x), wherein $0<x<1$, with tensile strain.

RELATED PUBLICATIONS

[J. del Alamo, S. Swirhun, R. M. Swanson, "Simultaneous Measurement of Hole Lifetime, Hole Mobility and Bandgap Narrowing in Heavily Doped n-Type Silicon", Tech. Dig. IEEE IEDM, 290 (1985). doi: 10.1109/IEDM.1985.190954]

[J. W. Slotboom, H. C. de Graaff, "Measurements of Bandgap Narrowing in Si Bipolar Transistors", Solid-State Electron., vol. 19, pp. 857-862, 1976. doi: 10.1016/0038-1101(76)90043-5]

[V. Palankovski, G. Kaiblinger-Grujin, S. Selberherr, "Study of Dopant-Dependent Band Gap Narrowing in Compound Semiconductor Devices", Materials Science & Engineering, vol. B66, pp. 46-49, 1999. doi: 10.1016/S0921-5107 (99) 00118-X]

[D. B. M. Klaassen, J. W. Slotboom, H. C. de Graaff, "Unified Apparent Bandgap Narrowing in n- and p-Type Silicon", Solid-State Electron., vol. 35, no. 2, pp. 125-129, 1992. doi: 10.1016/0038-1101(92)90051-D]

[Herbert S. Bennett, Charles L. Wilson, "Statistical Comparisons of Data on Band-Gap Narrowing in Heavily Doped Silicon: Electrical and Optical Measurements", J.Appl.Phys., vol. 55, no. 10, pp. 3582-3587, 1984. doi: 10.1063/1.332950]

[Yevgeny V. Mamontov, Magnus Willander, "Simulation of Bandgap Narrowing and Incomplete Ionization in Strained Si(1-x)Ge(x) Alloys on <001> Si Substrate (for Temperatures from 40K up to 400K)", Solid-State Electron., vol. 38, no. 3, pp. 599-607, 1995. doi: 10.1016/0038-1101(94)00142-3]

[G. Kaiblinger-Grujin, H. Kosina, S. Selberherr, "Influence of the Doping Element on the Electron Mobility in n-Silicon", J.Appl.Phys., vol. 83, no. 6, pp. 3096-3101, 1998. doi: 10.1063/1.367067]

[Jong-Sik Park, A. Neugroschel, F. Lindholm, "Comments on Determination of Bandgap Narrowing from Activation Plots", IEEE Trans. Electron Devices, vol. 33, no. 7, pp. 1077-1078, 1986. doi: 10.1109/T-ED.1986.22617]

[Z. H. Lu, M. C. Hanna, A. Majerfeld, "Determination of Band Gap Narrowing and Hole Density for Heavily C-doped GaAs by Photoluminescence Spectroscopy", Appl.Phys.Lett., vol. 64, no. 1, pp. 88-90, 1994. doi: 10.1063/1.110877]

[B. P. Yan, J. S. Luo, Q. L. Zhang, "Study of Band-Gap Narrowing Effect and Nonradiative Recombination Centers for Heavily C-doped GaAs by Photoluminescence Spectroscopy", J.Appl.Phys., vol. 77, no. 9, pp. 4822-4824, 1995. doi: 10.1063/1.359406]

[S. C. Jain, D. J. Roulston, "A Simple Expression for Band Gap Narrowing (BGN) in Heavily Doped Si, Ge, GaAs and Ge(x)Si(1-x) Strained Layers", Solid-State Electron., vol. 34, no. 5, pp. 453-465, 1991. doi: 10.1016/0038-1101 (91)90149-S]

[Z. Matutinovic-Krstelj, V. Venkataraman, E. J. Prinz, J. C. Sturm, C. W. Magee, "A Comprehensive Study of Lateral and Vertical Current Transport in Si/Si(1-x)Ge(x)/Si HBT's", in Intl.Electron Devices Meeting, pp. 87-90, 1993. doi: 10.1109/IEDM.1993.347392]

[M. Libezny, S. C. Jain, J. Poortmans, M. Caymax, J. Nijs, R. Mertens, K. Werner, P. Balk, "Photoluminescence Determination of the Fermi Energy in Heavily Doped Strained Si(1-x)Ge(x) Layers", Appl.Phys.Lett., vol. 64, no. 15, pp. 1953-1955, 1994. doi: 10.1063/1.111753]

[E. S. Harmon, Michael R. Melloch, Mark S. Lundstrom, "Effective Band-Gap Shrinkage in GaAs", Appl.Phys.Lett., vol. 64, no. 4, pp. 502-504, 1994. doi: 10.1063/1.111110]

[Huade Yao, A. Compaan, "Plasmons, Photoluminescence, and Band-Gap Narrowing in Very Heavily Doped n-GaAs", Appl.Phys.Lett., vol. 57, no. 2, pp. 147-149, 1990. https://doi.org/10.1063/1.103967 http://pascal-francis.inist.fr/vibad/index.php?action=getRecordDetail&idt=19253641]

[R. M. Sieg, S. A. Ringel, "Reabsorption, Band Gap Narrowing, and the Reconciliation of Photoluminescence Spectra with Electrical Measurements for Epitaxial n-InP", J.Appl.Phys., vol. 80, no. 1, pp. 448-458, 1996. doi: 10.1063/1.362746]

[C.-H. Wang and A. Neugroschel, "Minority-Carrier Transport Parameters in Degenerate n-Type Silicon", IEEE Electron Device Lett., vol. 11, no. 12, pp. 576-578, 1990. doi: 10.1109/55.63044]

What is claimed is:

1. A semiconductor bipolar phototransistor (PT) comprising:

a floating base consisting of a base (b) electrically coupled only to:

(i) an emitter (e) via an emitter junction (ej); and (ii) a collector (c) via a collector junction (cj) conductively, capacitively or inductively;

a substantially planar semiconductor surface or interface formed between the semiconductor and a dielectric; and a semiconductor volume of highest bandgap (Eg) whose bandgap is higher than the bandgap of the remaining semiconductor volume of the semiconductor bipolar phototransistor (PT) within about 1 micron linear distance from the substantially planar semiconductor surface or interface with the dielectric, wherein:

the emitter junction (ej) comprises an emitter junction (ej) portion with a bandgap lower than the bandgap of the highest bandgap volume;

the base (b) comprises a base (b) portion with a bandgap lower than the bandgap of the highest bandgap volume;

the collector junction (cj) comprises a collector junction (cj) portion with a bandgap lower than the bandgap of the highest bandgap volume;

a first low-doped region of the highest bandgap volume resides within the emitter junction (ej);

a second low-doped region of the highest bandgap volume resides within the base (b);

a third low-doped region of the highest bandgap volume resides within the collector junction (cj);

a minimum linear dimension of the highest bandgap volume is at least 10 nanometers;

the highest bandgap volume is substantially single crystalline; and the first, second, and third low-doped regions of the highest bandgap volume are not doped to higher than $10^{16}/cm^3$.

2. The semiconductor bipolar phototransistor (PT) according to claim 1, wherein the highest bandgap volume is substantially not strain-relaxed, is not compressively strained and is either lattice-matched or pseudomorphic to a bipolar phototransistor (PT) substrate.

3. The semiconductor bipolar phototransistor (PT) according to claim 1, wherein the highest bandgap volume has tensile strain and is pseudomorphic to a bipolar phototransistor (PT) substrate.

4. The semiconductor bipolar phototransistor (PT) according to claim 1 wherein the first, second, and third low-doped regions of the highest bandgap volume are not doped to higher than $10^{15}/cm^3$.

5. The semiconductor bipolar phototransistor (PT) according to claim 1 wherein the first, second, and third low-doped regions of the highest bandgap volume are not intentionally doped.

6. The semiconductor bipolar phototransistor (PT) according to claim 1 wherein the emitter comprises an emitter (e) portion with a bandgap lower than the bandgap of the highest bandgap volume.

7. The semiconductor bipolar phototransistor (PT) according to claim 1 wherein the collector comprises a collector (c) portion with a bandgap lower than the bandgap of the highest bandgap volume.

8. The semiconductor bipolar phototransistor (PT) according to claim 1, wherein the emitter comprises an emitter (e) portion, and the collector comprises a collector (c) portion, each portion having a bandgap lower than the bandgap of the highest bandgap volume.

9. The semiconductor bipolar phototransistor (PT) according to claim 1 wherein an additional region of the highest bandgap volume resides within the emitter (e).

10. The semiconductor bipolar phototransistor (PT) according to claim 1 wherein an additional region of the highest bandgap volume resides within the collector (c).

11. The semiconductor bipolar phototransistor (PT) according to claim 1 wherein two additional regions of the highest bandgap volume reside within the emitter (e) and the collector (c), respectively.

12. The semiconductor bipolar phototransistor (PT) according to claim 1 wherein at least one section of the highest bandgap volume is doped.

13. The semiconductor bipolar phototransistor (PT) according to claim 1 wherein at least one section of the highest bandgap volume is intentionally doped.

14. The semiconductor bipolar phototransistor (PT) according to claim 1 wherein the minimum linear dimension of the highest bandgap volume is less than 100 nanometers.

15. The semiconductor bipolar phototransistor (PT) according to claim 1 wherein the minimum linear dimension of the highest bandgap volume is less than 30 nanometers.

16. The semiconductor bipolar phototransistor (PT) according to claim 1 wherein the semiconductor volume of the highest bandgap (Eg) has bandgap higher than the bandgap of the remaining semiconductor volume of the semiconductor bipolar phototransistor (PT) within about 10 microns linear distance from the substantially planar semiconductor surface or interface with the dielectric.

17. The semiconductor bipolar phototransistor (PT) according to claim 1 wherein a bipolar phototransistor (PT) substrate is InP (doped or undoped indium phosphide), and wherein the highest bandgap volume comprises pseudomorphic strained In(x)Al(1-x)As, wherein $x=0.35\pm0.05$, with tensile strain.

18. The semiconductor bipolar phototransistor (PT) according to claim 1 wherein a bipolar phototransistor (PT) substrate is InP (doped or undoped indium phosphide), and wherein the highest bandgap volume comprises pseudomorphic strained In(x)Al(1-x)As, wherein $x=0.35\pm0.01$, with tensile strain.

19. The semiconductor bipolar phototransistor (PT) according to claim 1 wherein a bipolar phototransistor (PT) substrate is Si (doped or undoped silicon), and wherein the highest bandgap volume comprises pseudomorphic strained Si(1-x)C(x), wherein $0<x<1$, with tensile strain.

20. The semiconductor bipolar phototransistor (PT) according to claim 1 wherein the substantially planar semiconductor surface or interface with dielectric is substantially parallel to a bipolar phototransistor (PT) substrate.

21. An array of multiple semiconductor bipolar phototransistors (PTs) according to claim 1 sharing the same substantially planar semiconductor surface or interface with dielectric, and sharing an electrically conductively connected continuous common collector (c) or common sub-collector.

22. A method of fabricating a semiconductor bipolar phototransistor (PT) according to claim 1 comprising epitaxially growing the highest bandgap volume as an epitaxial layer comprising not intentionally doped region(s).

23. A method of fabricating a semiconductor bipolar phototransistor (PT) according to claim 1 comprising epitaxially re-growing the highest bandgap volume as an epitaxial re-growth layer comprising not intentionally doped region(s).

24. The semiconductor bipolar phototransistor (PT) according to claim 1, wherein a bipolar phototransistor (PT) substrate is InP (doped or undoped indium phosphide), and wherein the highest bandgap volume comprises In(x)Al(1-x)As, wherein $0<x<1$.

* * * * *